US012581757B2

(12) United States Patent
Zhu et al.

(10) Patent No.: US 12,581,757 B2
(45) Date of Patent: Mar. 17, 2026

(54) MULTIRESOLUTION IMAGER FOR NIGHT VISION

(71) Applicant: SRI International, Menlo Park, CA (US)

(72) Inventors: Rui Zhu, Princeton, NJ (US); Peter Alan Levine, West Windsor, NJ (US); John Robertson Tower, Poinciana, FL (US)

(73) Assignee: SRI International, Menlo Park, CA (US)

(*) Notice: Subject to any disclaimer, the term of this patent is extended or adjusted under 35 U.S.C. 154(b) by 398 days.

(21) Appl. No.: 17/764,087

(22) PCT Filed: Sep. 3, 2020

(86) PCT No.: PCT/US2020/049267
§ 371 (c)(1),
(2) Date: Mar. 25, 2022

(87) PCT Pub. No.: WO2022/050947
PCT Pub. Date: Mar. 10, 2022

(65) Prior Publication Data

US 2024/0006430 A1 Jan. 4, 2024

Related U.S. Application Data

(63) Continuation-in-part of application No. 16/375,059, filed on Apr. 4, 2019, now Pat. No. 10,827,139, (Continued)

(51) Int. Cl.
*H04N 25/771* (2023.01)
*H04N 25/533* (2023.01)
(Continued)

(52) U.S. Cl.
CPC ..... *H10F 39/80373* (2025.01); *H04N 25/533* (2023.01); *H04N 25/57* (2023.01);
(Continued)

(58) Field of Classification Search
CPC ........ H04N 25/46; H04N 25/59; H04N 25/77; H04N 25/771; H04N 25/778
(Continued)

(56) References Cited

U.S. PATENT DOCUMENTS 3,953,733 A 4/1976 Levine
7,020,353 B1 3/2006 McCaffrey et al.
(Continued)

FOREIGN PATENT DOCUMENTS

JP 2013-055500 A 3/2013

OTHER PUBLICATIONS

International Search Report and Written Opinion, PCT/US2020/049267, ISA:US, Aug. 7, 2018, 16 pages.
(Continued)

*Primary Examiner* — Anthony J Daniels
(74) *Attorney, Agent, or Firm* — Rutan and Tucker, LLP

(57) ABSTRACT

An image sensor having a set of pixels making up the image sensor to capture an image. Two or more pixels in the set of pixels each have an architecture that includes multiple photodiodes configurable to form an individual pixel. A control system can cooperate with the multiple photodiodes to form the individual pixel. Each of the multiple photodiodes can have a transfer gate electrically coupled to that photodiode. A common region can hold or transfer charge at least during or after an integration time. A read gate electrically coupled to the common region and a sense node, can supply charge from the common region through the read gate to the sense node.

17 Claims, 4 Drawing Sheets

Related U.S. Application Data which is a continuation-in-part of application No. 16/175,662, filed on Oct. 30, 2018, now Pat. No. 10,535,690, which is a continuation of application No. 15/238,063, filed on Aug. 16, 2016, now Pat. No. 10,257,448.

(60) Provisional application No. 62/652,891, filed on Apr. 4, 2018, provisional application No. 62/206,417, filed on Aug. 18, 2015.

(51) Int. Cl.

| | |
|---|---|
| ***H04N 25/57*** | (2023.01) |
| ***H04N 25/583*** | (2023.01) |
| ***H04N 25/778*** | (2023.01) |
| ***H10F 39/00*** | (2025.01) |

(52) U.S. Cl.
CPC ......... *H04N 25/583* (2023.01); *H04N 25/771* (2023.01); *H04N 25/778* (2023.01); *H10F 39/802* (2025.01); *H10F 39/813* (2025.01)

(58) Field of Classification Search
USPC .................................................... 348/207.99
See application file for complete search history.

(56) References Cited

U.S. PATENT DOCUMENTS

| | | | | |
|---|---|---|---|---|
| 8,445,828 | B2 | 5/2013 | He | |
| 8,766,157 | B2 | 7/2014 | Levine et al. | |
| 10,257,448 | B1 | 4/2019 | Tower et al. | |
| 10,535,690 | B1 | 1/2020 | Tower et al. | |
| 10,827,139 | B2 | 11/2020 | Tower et al. | |
| 2004/0251394 | A1* | 12/2004 | Rhodes | H04N 25/587 348/E3.019 |
| 2007/0023798 | A1 | 2/2007 | McKee | |
| 2007/0035649 | A1 | 2/2007 | McKee | |
| 2009/0108176 | A1 | 4/2009 | Blanquart | |
| 2011/0019049 | A1 | 1/2011 | Jin et al. | |
| 2013/0057744 | A1 | 3/2013 | Minagawa et al. | |
| 2013/0300904 | A1 | 11/2013 | Sugiyama et al. | |
| 2014/0211056 | A1* | 7/2014 | Fan | H10F 39/809 257/292 |
| 2015/0055000 | A1 | 2/2015 | Bock | |
| 2015/0201140 | A1 | 7/2015 | Solhusvik et al. | |
| 2015/0294999 | A1 | 10/2015 | Zhang | |
| 2015/0312557 | A1 | 10/2015 | Kim | |
| 2015/0350583 | A1* | 12/2015 | Mauritzson | H01L 27/14647 257/432 |
| 2016/0028985 | A1 | 1/2016 | Vogelsang et al. | |
| 2016/0037109 | A1 | 2/2016 | Vogelsong | |
| 2016/0255289 | A1 | 9/2016 | Johnson et al. | |
| 2017/0034411 | A1 | 2/2017 | Okura et al. | |
| 2017/0180667 | A1 | 6/2017 | Nie et al. | |
| 2017/0347047 | A1 | 11/2017 | Mao et al. | |
| 2018/0152677 | A1 | 5/2018 | Komori et al. | |
| 2019/0014273 | A1 | 1/2019 | Geurts | |
| 2019/0386057 | A1* | 12/2019 | Wang | H01L 27/14641 |

OTHER PUBLICATIONS

Final Office Action for U.S. Appl. No. 15/238,063 mailed May 1, 2018, 14 pages.
Advisory Action Before the Filing of an Appeal Brief for U.S. Appl. No. 15/238,063 mailed Aug. 13, 2018, 3 pages.
Advisory Action Before the Filing of an Appeal Brief for U.S. Appl. No. 15/238,063 mailed Sep. 6, 2018, 3 pages.
Non-Final Office Action for U.S. Appl. No. 15/238,063 mailed Nov. 6, 2017, 14 pages.
AFCP 2.0 Decision for U.S. Appl. No. 15/238,063 mailed Sep. 6, 2018, 1 page.
Non-Final Office Action for U.S. Appl. No. 16/175,662 mailed Feb. 25, 2019, 15 pages.
Non-Final Office Action for U.S. Appl. No. 16/375,059 malled Oct. 21, 2019, 17 pages.
Japanese Patent Office, Notification of Reason(s) for Refusal, Oct. 22, 2024, 2 pp.

* cited by examiner

MULTIRESOLUTION IMAGER FOR NIGHT VISION

INCORPORATION BY REFERENCE

This application is a 35 U.S.C. § 371 U.S. National Stage of International Patent Application No. PCT/US2020/049267, titled "MULTIRESOLUTION IMAGER FOR NIGHT VISION," having an International Filing Date of Sep. 3, 2020, which claims the benefit under 35 USC 120 and priority to, as a continuation-in-part of patent application Ser. No. 16/375,059, titled "Multiple Window, Multiple Mode Image Sensor," filed: Apr. 4, 2019, now U.S. Pat. No. 10,827,139, which claimed the benefit under 35 USC 120 and priority to, as a continuation-in-part of, U.S. application Ser. No. 16/175,662, titled "Extended dynamic range imaging sensor and operating mode of the same," filed on Oct. 30, 2018, now U.S. Pat. No. 10,535,690, which claimed the benefit as a continuation application of U.S. patent application Ser. No. 15/238,063 titled "Extended dynamic range imaging sensor and operating mode of the same," filed on Aug. 16, 2016, now U.S. Pat. No. 10,257,448, which claimed the benefit under 35 USC 119 of U.S. provisional patent application Ser. No. 62/206,417, filed on Aug. 18, 2015 and entitled "Extended dynamic range (XDR) CMOS pixel and operating mode." All of the applications mentioned in this specification herein are incorporated by reference in their entirety to the same extent as if each individual publication was specifically and individually indicated to be incorporated by reference.

GOVERNMENT RIGHTS

This invention was made with government support under the Other Transaction Agreement W909MY-18-9-0001 awarded by the U.S. Army Contracting Command. The government has certain rights in the invention.

BACKGROUND

The field of the invention relates generally to imaging devices. More particularly, an embodiment of the present disclosure is directed to complementary metal-oxide-semiconductor ("CMOS")-based imaging sensors capable of a wide range of operation.

Imaging sensors typically include an array of pixels that contain light-sensitive elements commonly known as photodetectors, such as CMOS or charge-coupled device ("CCD") sensors. In general, photodetectors accumulate charge in accordance with the incident light during what is known as an integration period.

A previous quad pixel imager had a sense node that needed to be large enough so four photodiodes can sequentially transfer signal charge through four transfer gates directly into that sense node. This geometry can result in a higher capacitance sense node than non-quad pixel imagers partially because of the four sequential transfers and their transfer gates coupling to the sense node. In addition, the sense node needs be large in order to directly receive charge from the photodiodes. Therefore, read noise can be higher than non-quad pixels.

A rolling shutter can image capture a still picture or a single frame of a video, which is not captured by taking a snapshot of the entire scene at a single instant in time (e.g. a global shutter) but rather by scanning rapidly across the rows of pixels, and then performing a readout operation.

SUMMARY

A machine, a process, and a system are discussed for a multiresolution imager that is capable of night vision. An image sensor has a set of pixels making up the image sensor to capture an image. Two or more pixels in the set of pixels each have an architecture that includes multiple photodiodes that can be formed by the controller into an individual pixel. The control system is configured to cooperate with the multiple photodiodes in the individual pixel, including a first photodiode and a second photodiode of the multiple photodiodes. Each photodiode can have a transfer gate electrically coupled to that photodiode. A common region can hold or transfer charge at least during or after an integration time. A read gate electrically coupled to the common region and a sense node can supply charge from the common region through the read gate to the sense node. Thus, the common region can be operated as a charge transfer channel to move charge from the transfer gate output to the sense node. Each pixel can have at least one of 1) the common region electrically coupled to the sense node, 2) one or more read gates electrically coupled to the sense node, and 3) any combination of both, to hold or transfer charge received from at least the first photodiode, at least during or after an integration time.

These and other features of the design provided herein can be better understood with reference to the drawings, description, and claims, all of which form the disclosure of this patent application.

DETAILED DISCUSSION

As will be discussed in much detail later, the control system for the pixel and its components can send control signals to change the way these components operate via changing their imaging modes of operation. The architecture of the pixel and its components support an example imaging mode of operation, which is a low light mode using a rolling shutter process that incorporates some aspects of a global shutter process. The low light mode using a rolling shutter process using the pixel and its components allows the imager to trade resolution for low light level sensitivity as well as provides an extended dynamic range. The low light mode using a rolling shutter process with the pixel and its components uses charge binning from multiple photodiodes, at a same time, in the rolling shutter mode, during the integration time, to improve the dynamic range and the low light level sensitivity. A baseline imager pixel for a night vision camera with reduced read noise and longer detection range at the lowest of light levels can use the low light mode using a rolling shutter process with the pixel and its components charge binning from multiple photodiodes at a same time during the integration time. Again, other imaging modes of operation with this pixel architecture are possible and will be discussed later but the pixel architecture and how the control system will operate these components in the low light mode using a rolling shutter process, to bin charge from multiple photodiodes at a same time, during the integration time will be initially discussed.

Imagers typically include an array of pixels that contain light-sensitive elements commonly known as photodetectors, such as CMOS or charge-coupled device ("CCD") sensors. In general, photodetectors accumulate charge in accordance with the incident light during what is known as an integration period. If a photodetector becomes full, or saturated, before the end of the integration period, additional light from a bright scene striking the photodetector does not accumulate any further charge, and stores no further information.

Figure 1:
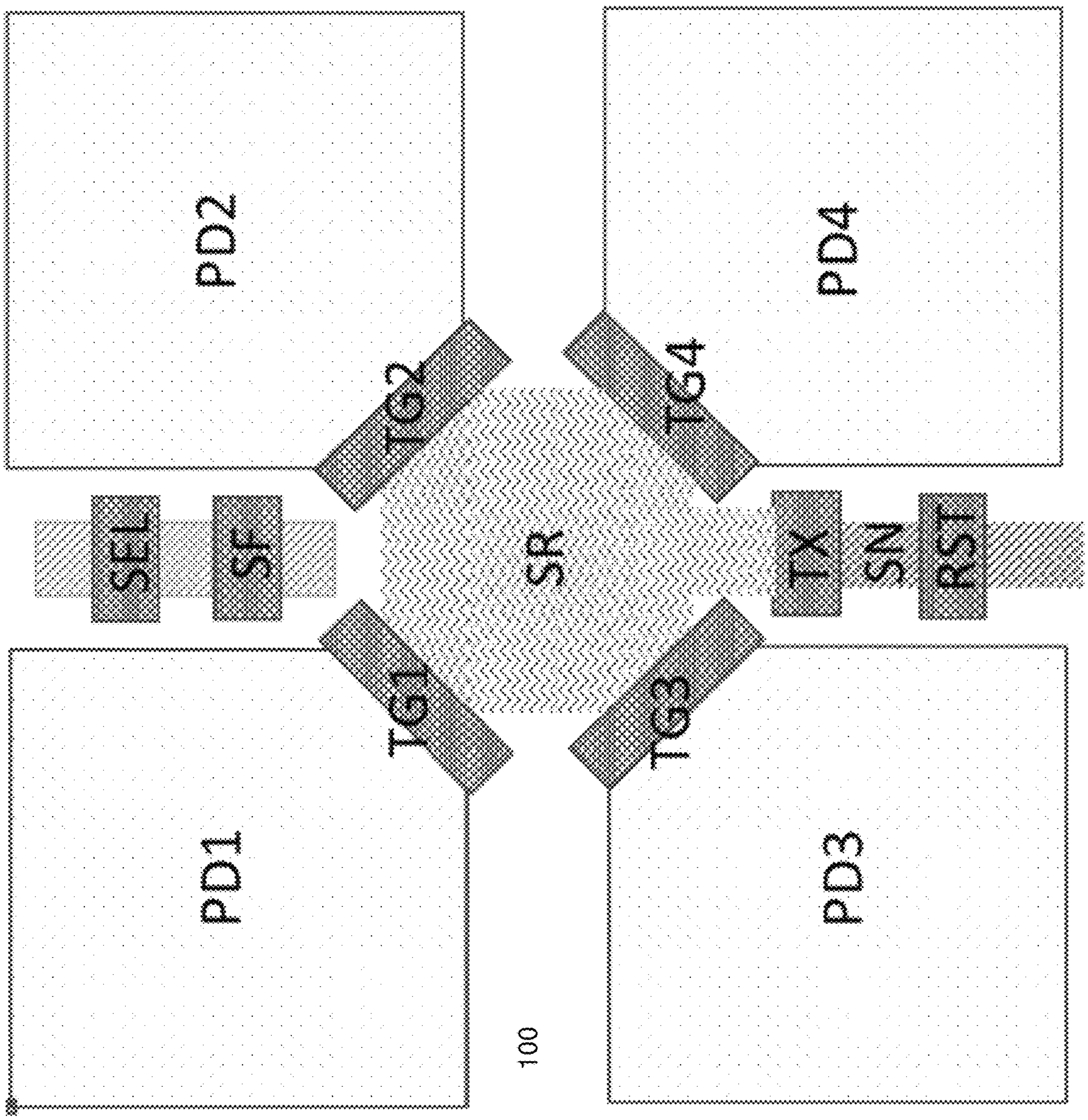
FIG. 1 illustrates an embodiment of a block diagram of an example pixel with multiple photodiodes simultaneously collecting charge to be moved through an associated photodiode transfer gate, into a common region, during or after an integration time, as well as a read gate electrically coupled to the common region to transfer the binned charge from the common region through the read gate to the sense node during a read operation.

The transfer gates, such as a transistor, metal oxide device, etc., for each photodiode have control signals going to them to control the integration time for that particular photodiode; and thus, how long that photodiode collects photons before its associated transfer gate allows the accumulated charge in the photodiode to be sensed at the common sense node. Also, a control signal controls the gate connecting the MIM gain capacitor to the sense node. The MIM gain capacitor can be selectively connected to the sense node during a read out to modify the capacitance of the sense node; and thus, have FIG. 1 illustrates an embodiment of a block diagram of an example pixel with multiple photodiodes simultaneously collecting charge to be moved through an associated photodiode transfer gate, into a common region, during or after an integration time, as well as a read gate electrically coupled to the common region to transfer the binned charge from the common region through the read gate to the sense node during a read operation.

Each pixel in the image sensor has an architecture that can include multiple photodiodes and other components forming the individual pixel 100.

The pixel 100 is a 'detector' of light for the image sensor. These can be individual photodiode readouts through a common output stage. In addition, charge from multiple photodiodes can be readout through the common output stage. The controller can send control signals to the photodiodes such that without binning, one photodiode can be within one pixel, but with binning, up to, for example, four photodiodes can have their charge binned to form one pixel. Thus, with no binning one photodiode and the other components making up a pixel 100 can be one pixel in the display. This is how a simple camera would see this. Also, the image sensor in an example video camera may be listed as a 24 megapixel image sensor. The measure of pixels in the image sensor typically refers to the minimal displayable unit, so this refers to the unbinned case, where each "pixel" is operated to be a photodiode. However, as discussed in different modes of operation of a more advanced camera or a video camera, the controller may operate those, for example, 24 mega pixels in different ways to form each pixel detecting light. If the controller bins all four photodiodes, then the four photo diodes and the other components making up a pixel 100 can form one pixel in the display. Therefore, in essence, four photo diodes would to be a single pixel in the display. There are photo diodes and displayed pixels. The common output stage does not always define a pixel. A pixel is how the photo diodes appear in an output to form the image. An imager sensor with N pixels (in this case N is the individual photo diodes) has the capability of, for example, 4 to 1 or 2 to 1 charge binning of these photodiodes. The group of binned pixels does become the displayed pixel.

Again, in a mode of operation controlled by the controller, the multiple photodiodes making up a pixel 100 are readout through a common output stage. For example, a quad pixel has all four photo diodes converted from charge to voltage and sent to a signal line by the common output stage. The photo diodes can be binned or not binned but will all pass through the common output stage. The common output stage can be considered to consist of: the sense node SN, a source follower buffer SF, a row select transistor SEL and a reset transistor RST which is integrated with the sense node. All these components are related to reading out the signal.

The individual pixel 100 can have multiple photodiodes, e.g. PD1-PD4, which each have an associated transfer gate TG1-TG4 electrically coupled to that photodiode. The multiple photodiodes PD1-PD4 can form the individual pixel 100, during integration time, collect photons to create charge and then can direct the charge signals through its own transfer gate (respectively TG1-TG4) associated with that photodiode. The charge from two or more of the photodiodes PD1-PD4 can be essentially 'noiselessly' binned simultaneously in the common region SR during a phase of the integration time.

Two or more pixels in the set of pixels each have an architecture that includes multiple photodiodes that can be formed by the controller into an individual pixel 100. The control system is configured to cooperate with the multiple photodiodes in the individual pixel 100 to include at least a first photodiode PD1 and a second photodiode PD2 of the multiple photodiodes. The multiple photodiodes are readout through a common output stage that includes the sense node SN. The pixel 100 further can include at least one of 1) a common region SR electrically coupled to the sense node SN to hold or transfer charge received from at least a photodiode, at least during or after an integration time, 2) one or more read gates TX electrically coupled to the sense node SN to hold or transfer charge received from at least a photodiode, at least during or after the integration time, and 3) any combination of both 1) and 2) to hold or transfer charge received from at least a photodiode, at least during or after the integration time.

This common region SR electrically couples to each transfer gate TG1-TG4. This common region SR also couples, via a read gate TX, to the sense node SN. One or more common regions SR can be implemented and each is configured to i) temporarily transfer thru the charge during a clock cycle or so e.g. see FIG. 2; or ii) hold charge for a long duration such as capable of storing a charge for many clock cycles e.g. see FIG. 1. The common region SR generally bins/sums the charge from the multiple photodiodes PD1-PD4, at the same time, during the integration time, when in the low light mode using the rolling shutter process. A read gate TX electrically couples to the common region SR and a sense node SN in order to supply charge from the common region SR through the read gate TX to the sense node SN during a read operation.

The common region SR is used for binning charge from two or more of the photodiodes PD1-PD4 in the integration time and transferring charge during a read out operation. In a first case, when charges passes through the common region SR ultimate binning occurs at the sense node SN. Some binning will occur in the common region SR when operated this way. In a second case, when charge is stored in common region SR then all of the binning occurs in the common region SR. Note, in other modes of operation, the common region SR is also used for a single photo diode readout for high resolution. In this case there is no binning, but the signal follows the same path as binning multiple diodes. Reading a single pixel is different from global shutter. Charge is held in the common region SR for a fraction of a row time. For global shutter operation, charge is held in the common region SR at least a full row time but more likely multiple row times.

The sense node SN is used to read out charge during a read out operation. The sense node SN can achieve a high conversion gain and lower readout noise by converting charge to a voltage signal when the sense node SN has a lower capacitance. A size of the sense node SN can be set small enough to accommodate to connect merely to, in this example, the one read gate TX verses all four of the transfer gates TG1-TG4 in order to lower a noise threshold required during a read operation. Note, to complete the read operation, a sense node reset occurs, after a readout, when the reset gate RST is turned on.

During the readout operation, the charge in the sense node SN is readout using the source follower transistor SF and the row select transistor SEL, producing a voltage signal on the column bus (which has a current source load). The readout transistors that cooperate for the read operation are labeled: read gate (TX), Source Follower (SF), Row Select (SEL), and Reset (RST).

A first step of a read operation can be to transfer the charge being held in the common region SR to the sense node SN for has been broken into two distinct steps (e.g. 1) the transfer gates TG1-TG4 are switched off and then 2) the read gate TX is turned on.

Thus, charge is binned in a potential well-formed preferably by a buried channel well. The charge is transferred from multiple photodiodes to the common region SR with its potential well. In the common region SR more than one photodiode can be summed/bin in the well. Next, a second transfer from the potential well to the sense node SN generates the voltage output. This low light mode allows a smaller sense node so charge conversion of Volts/electron is higher; and therefore, read noise lower.

In an example low light operation, at least the top two photodiodes PD1-PD2 and their associated transfer gates TG1-TG2 are sent control signals by the control system to have these transfer gates to 'switch on' in order to simultaneously supply their charge to the common region SR during the integration time. In the common region SR, the charge from at least these two photodiodes PD1-PD2 is binned during the integration time. For the even lowest noise and most extended range imaging mode of operation, all four photodiodes PD1-PD4 and their associated transfer gates TG1-TG4 are sent control signals to simultaneously 'switch on' in order to transfer their charge to the common region SR during the integration time in order for the common region SR to bin the charge from all four photodiodes PD1-PD4 simultaneously. When all four photodiodes have their charge binned in the common region simultaneously, then merely one read operation on the sense node SN occurs to read that binned charge; whereas, typically the noise associated with four sequential read operations is required to obtain the total charge from all four photodiodes PD1-PD4. Noise is thus reduced by three read operations compared to some other quad pixel designs. In addition, the common region holds (potentially storing) charge from the multiple photodiodes PD1-PD4 and then transfers the binned/summed charge to the sense node SN in order to keep a size dimension of the sense node SN small and any parasitic transfer gate capacitance also small in order to reduce readout noise. The common region SR transferring charge during a read operation allows the sense node SN and its read gate TX to be small and have less capacitance. Merely one read gate TX (in some architectures two read gates) couples to the area making up the sense node SN rather than four transfer gates TG1-TG4 that each add parasitic capacitance to the sense node SN. The lower capacitance allows better noise levels during a read operation, which allows detection in low light conditions (e.g. a moonless night with merely starlight), and lowers the noise threshold level at which no useable signal can be detected.

Structurally, each transfer gate TG1-TG4 has its own channel formed under each of the transfer gates TG1-TG4 to feed charge to the common region. At least a portion of a well forming the common region SR is located underneath each transfer gate TX if more than one are implemented. The potential well is formed preferably by a buried channel well. The transfer gates TG1-TG4, such as a transistor, metal oxide device, etc., for each photodiode have control signals going to them from the control system to control the integration time for that particular photodiode; and thus, how long that associated photodiode e.g. PD1-PD4 collects photons before its associated transfer gate TG1-TG4 allows the accumulated charge from the photodiode to move to the common region SR.

Note, in an embodiment, the common region SR is constructed with a well that is built to store charge over many cycles. The common region can be a well that stores charge potential which can be formed by a virtual gate or a poly gate. A challenge with the pixel architecture in FIG. 1 is that because charge is stored in the common region, then the area needs to be a large enough to hold the desired maximum charge. This reduces space available for photodiodes PD1-PD4 and lowers quantum efficiency. Without the inspiration that this architecture could result in lower noise, this approach might not seem logical. Also, if the common region SR becomes too large, transferring charge to the sense node SN can take a longer time than desired/allowed in the operational mode. Therefore, in an embodiment, charge capacity of the common region SR can be set to small enough to allow for the required charge transfer time to the sense node SN and then merely to a minimum needed to support actually storing the anticipated amount of charge.

The common region SR can have charge channels. The common region SR can have charge channels from a photodiode output from each of the photodiodes PD1-PD4 and that run beneath the transfer gate TG1-TG4 associated with its photodiode, through the well of the common region SR, and to the read gate TX. Note, the too large of a sense node SN problem can be solved by adding these charge channels from the photodiode output and under the transfer TG gate, through the well, and to the read gate TX, which allows the sense node SN to be remote from the four photodiodes PD1-PD4, but still in the pixel. With the addition of the channel spanning from the output of the photodiode to the well of the sense node SN and onto the read gate, allows the well to no longer need to be large enough to accommodate a direct transfer of charge from all the four photodiodes PD1-PD4 simultaneously. Again, this approach can reduce noise to or near to the noise threshold level for imager that do not use a quad pixel architecture.

The common region SR between the transfer gates TG1-TG4 and the sense node can be a charge binning region with a read gate to hold/store that charge in the common region SR. The common region SR is where charge from the four photodiodes PD1-PD4 are binned and then transferred to the sense node SN through one read gate TX1. This charge binning region can hold/store charge for a frame time to allow global shutter operation, and this charge binning region can also hold charge for less than a row time for rolling shutter operation.

The image sensor containing the pixels has a control system that can implement a rolling shutter, a global shutter, as well as operate in different imaging modes of operation. The control system can send control signals to operate the image sensor in a hybrid global shutter and rolling shutter operational mode. In this rolling shutter mode with some global shutter aspects, the control system starts an integration time by sending control signals to simultaneously collect charge from multiple photodiodes, and by sending another signal to transfer the accumulated in the multiple photodiodes through an associated transfer gate TG coupled to that photodiode into a common region SR. The common region SR sums/bins charge supplied by the two or more photodiodes PD1-PD4 during the integration time. During a read operation, the control system sends control signals to transfer the binned charge in the common region SR through a read gate TX to a sense node SN. The image sensor with the rolling shutter reads out a row of photodiodes in the image sensor on row of photodiodes by row of photodiodes basis instead of all of the rows being read at a same time.

An advantage of the pixel architecture in FIG. 1 is the 4× binned pixel can be operated in either a global shutter mode simultaneous binning of all of the photodiodes with all rows read at the same time or preferably in a rolling shutter mode with an aspect of simultaneous binning of multiple photodiodes, but on a row by row basis, which provide less geometric distortion in the displayed image for moving objects.

The quad pixel architecture may be a CMOS pixel with four photodiodes PD1-PD4 in the pixel 100 on a substrate.

Figure 2:
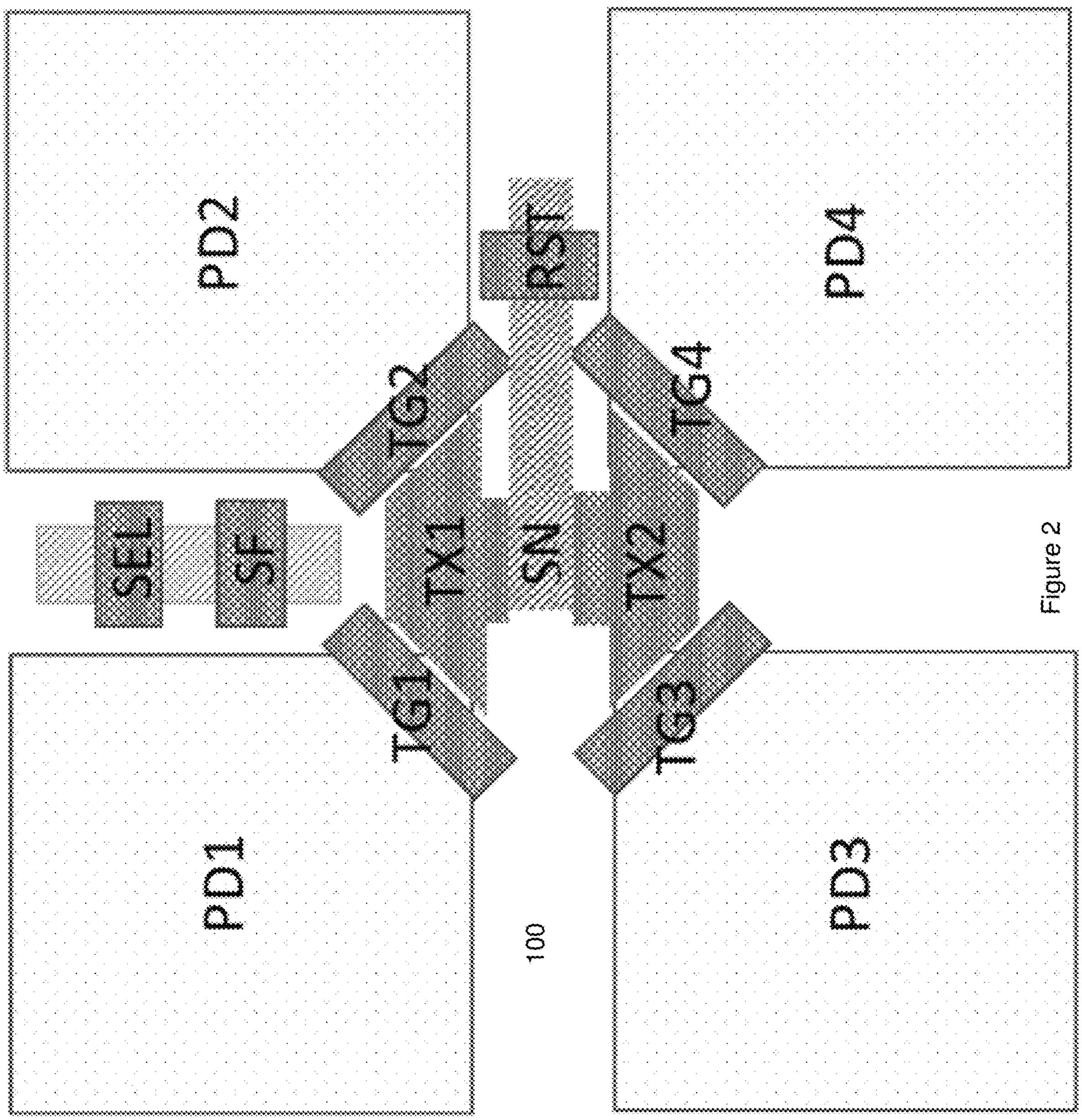
FIG. 2 illustrates an embodiment of a block diagram of an example pixel with multiple photodiodes simultaneously collecting charge transferred through each transfer gate into multiple common regions during an integration time, and then supplying the charge in each common region through a read gate coupled to that common region to be binned together in a sense node.

FIG. 2 illustrates an embodiment of a block diagram of an example pixel with multiple photodiodes simultaneously collecting charge transferred through each transfer gate into multiple common regions during an integration time, and then supplying the charge in each common region through a read gate coupled to that common region to be binned together in a sense node. Note, as shown the common region is actually part of each read gate TX1-TX2. Thus, the one or more read gates include at least a first read gate TX1 and a second read gate TX2 as well as are configured to function as the common region. The common region (SR from FIG. 1) is thus split into a first common region (TX1 as shown in FIG. 2) to transfer the charge from the first photodiode PD1 and the second photodiode PD2 during the integration time, and a second common region (TX2 as shown in FIG. 2) to transfer charge from a third photodiode PD3 and a fourth photodiode PD4 during the integration time. The read gates TX1-TX2 here act as a conduit leading charge to sense node. They can only transfer charge but not store charge.

The pixel architecture of FIG. 2 has two read gates, TX1 and TX2. Each read gate TX1 or TX2 couples to two transfer gates TG1-TG2 or TG3-TG4 and then to the sense node SN. Unlike the common region SR in FIG. 2 which can store charge until slowly and securely being transferred to the sense node SN, a portion of the transfer gate TG1-TG4, here merely temporarily holds onto charge. The two read gates TX1-TX2 serve as charge transfer gates to the sense node SN. The charge from the four photodiodes PD1-PD4 is actually binned in the sense node. Thus, the charge binning of 2, 3, or all 4 photodiodes simultaneously can be performed by this architecture but in the sense node SN instead of in a common region. Note, the common regions can act as channel to the sense node SN directly from the associated TG gate output TG1-TG4.

Read gates TX1 and TX2 can be implemented by using a poly gate. The small size of read gates TX1 and TX2 also permits larger photodiodes PD1-PD4 within a given quad area resulting in higher quantum efficiency. The sense node SN area is still much smaller than previous designs. Merely two small read gates TX couple to the area of the sense node SN rather than four transfer gates TG1-TG4 that each add parasitic capacitance to the sense node SN. The overlap capacitance is further reduced by the small size of the sense node SN.

In FIG. 2, in an embodiment, the architecture needs no read gate TX. Instead, the architecture could have a common region coupled to the sense node and one or more transfer gates (TG). The common region can be configured to transfer and move charge to the sense node during integration time. The common region need not hold the charge but merely transfer the charge.

Referring to FIG. 1, the example pixel with multiple photodiodes simultaneously collects charge transferred through each transfer gate into multiple common regions for summing/binning charge supplied by two or more photodiodes during an integration time, and then supplying the binned charge in each common region through a read gate to a sense node during a read operation.

The pixel 100 has four transfer gates TG1-TG4 each on an edge of its associated photodiode PD1-PD4. A center channel between the top two transfer gates TG1-TG2 acts as a common region SR1 to store charge of two photodiodes PD1-PD2 as well as bins the charge from these two photodiodes PD1-PD2. Likewise, a center channel between the top two transfer gates TG3-TG4 acts as a common region SR2 to store charge of two photodiodes PD3-PD4 as well as bins the charge from these two photodiodes PD3-PD4. All four of the transfer gates TG1-TG4 electrically couple to a read gate TX through their channel. The read gate TX couples to the sense node SN. The sense node SN also has a gain capacitor GC electrically coupled to the sense node SN.

In an embodiment, the first storage region SR1 is a well formed by the long and deep center channel between the top two transfer gates TG1-TG2. The second storage region SR 2 is a well formed by the long and deep center channel between the bottom two transfer gates TG3-TG4.

The read gate TX1 transfers the charge from the first common region SR1 and the second common region SR2 through the read gate TX1 to the sense node SN during the read operation.

Figure 3:
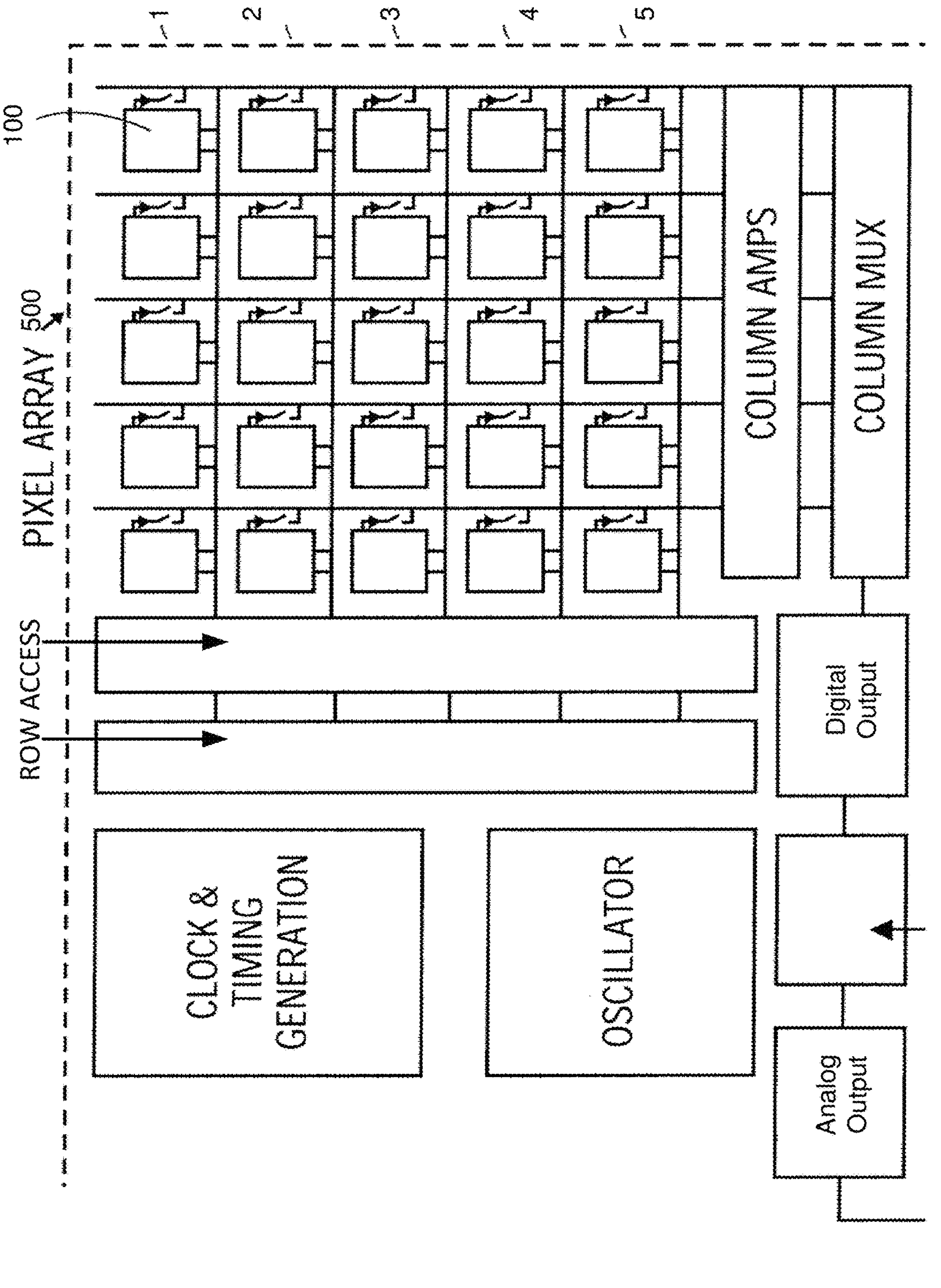
FIG. 3 illustrates an embodiment of a block diagram of an example image sensor having a set of pixels making up the image sensor to capture an image.

FIG. 3 illustrates an embodiment of a block diagram of an example image sensor having a set of pixels making up the image sensor to capture an image. The image sensor has an array 500 with columns and rows of pixels. In this example, the image sensor is configured to capture an image, and has five rows and columns of pixels (rows 1-5) including an example pixel 100.

Figure 4:
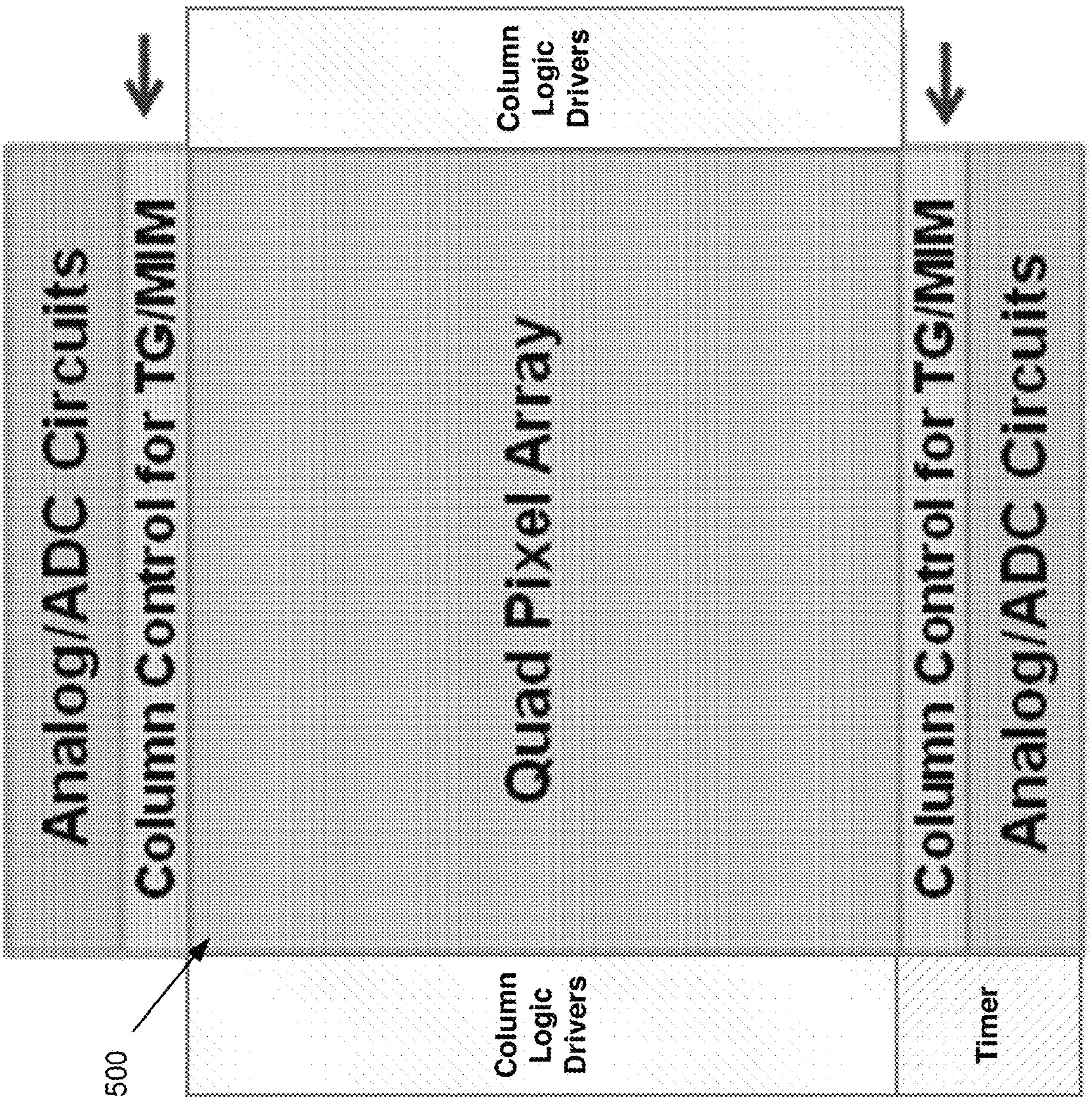
FIG. 4 illustrates an embodiment of a block diagram of a control system and pixel array for an image sensor having a set of pixels making up the image sensor to capture the image, where each pixel has an architecture that includes multiple photodiodes forming the individual pixel similar to the example pixels shown in FIGS. 1-2.

FIG. 4 illustrates an embodiment of a block diagram of a control system and pixel array for an image sensor having a set of pixels making up the image sensor to capture the image, where each architecture includes photodiodes similar to the example pixels shown in FIGS. 1-2. The control system may include components such as a controller having two or more decoders implemented in Analog/ADC circuits, a column and row control circuit for each transfer gate of the photodiodes in the quad pixel array of pixels 500, the MIM gain capacitor, the read gates, the Reset switch, and the Row select switch, column logic drivers, and a timing circuit.

The control system can use two or more decoders. The two or more decoders cooperate with a timer to direct control signals to control i) frame rate, ii) integration times of the multiple photodiodes, and iii) binning of the multiple photodiodes on a per pixel basis to allow multiple pixels in the array 500 of pixels to operate in the different imaging-modes of operation. Again, the control system is configured to cooperate with the multiple photodiodes to configure the multiple photodiodes to form the detector of the individual pixel and/or a single photodiode to form the detector of the individual pixel.

The control system in night vision/low light mode can be configured to send a first control signal for the multiple photodiodes to simultaneously collect charge during an integration time and the associated transfer gates to switch off. Next, the associated transfer gates upon receiving a second control signal to move the charge accumulated in at least two or more of the multiple photodiodes at a same time through their associated transfer gate coupled to that photodiode into one or more common regions for holding the charge for a subsequent read operation. In many of the architectures, the one or more common regions bin charge supplied by the two or more photodiodes during the integration time. The read gates are also switched off to keep the charge in the common regions until the read operation occurs. The control system then sends a third control signal during a read operation to transfer the binned charge in the common region through the read gate, by switching the read gate on, to the sense node. The transfer gates can also receive a signal to make sure no charge leaks back into the photodiodes. The control system when operating in a rolling shutter mode is configured to do the above sequence a on row of photodiodes by row of photodiodes basis doing all of the rows within a time frame of one image frame. The control system can send a control signal to the rest of the set of read transistors (discussed earlier) and the gain capacitor to finish off the read operation.

The control system is configured to analyze the scene being captured in an image. The control system selects different imaging-modes of operation for two or more pixels in a row based on imaging conditions in the scene content, such as different light intensities and frame rate needed, within the scene being captured by the plurality image pixels. The controller may operate the imaging sensor by:

selecting a different imaging-mode of operation for at least two pixels based on imaging conditions captured in the pixel 100; and assembling an image using collected data signals reflective of the accumulated charge and other imaging conditions obtained from a plurality of pixels from the readout.

All of the pixel architectures in FIGS. 1-2 can include an extra MIM capacitor GC to allow switchable capacitance to sense node SN to alter the capacitance; and, resulting gain.

The control system can be configured to transfer charge to a common region, store the charge there more than a row time, and then readout with a readout gate TX. The control system can also be configured to transfer charge to a common region in order to bin there and store charge there only for a fraction of row. The purpose is completely different.

The image sensor routes the wire traces/conductor paths for the control signals to allow different modes of operation with the example quad pixel/electrical circuit. The controller may control the timing of control signals to each pixel in each row of the imager in order to achieve the envisioned imaging-modes of operation that include:

1.) An unbinned photodiode readout of photodiodes PD1-PD4 sequentially in order, each potentially with a different integration time for a high resolution. Each transfer gate associated with its photodiode is sequentially switch on in order to transfer charge from the photodiode through the associated transfer gate into the common region. For the highest resolution readout mode, the control system during an integration time sends signals to sequentially collect charge from a single photodiode and transfers the charge using the associated transfer gate to the common region potential well. Charge in the common region is then transferred to the sense node using the transfer gate. Alternatively, charge is transferred to the sense node by merely using the transfer gate. Again, the control system repeats this process sequentially in order for the other three photodiodes.

2.) For the highest sensitivity mode, all four photodiodes can have their charge noiselessly binned in one common region sequentially to form a super pixel with 4× signal. Next, during the read operation, the binned charge stored in storage region is transferred so to sense node using the read gate.

3.) A binned photodiode readout of multiple photodiodes simultaneously or with each in one or more storage regions. For example, 1) all of the photodiodes, e.g. PD1-PD4, are simultaneously binned in one common region or 2) each pair e.g. PD1-PD2, and then e.g. PD3-PD4 having their accumulated charge from their integration times binned together in their own common regions during integration time. When all of the charge from the photodiodes is not binned in one common storage region during the integration time, a binned photodiode readout mode can have multiple photodiodes having their accumulated charge from their integration times binned together at the sense node. The controller can bin any combination, for example, of two, three, or four photodiodes e.g. PD1-PD4 to collect and read out charge/signal level. The controller and the timer cooperate to have the transfer gates of the binned photodiodes switched on and the read gate for the common region switched off, via pulsed all at a same time. The binning of charge from multiple photodiodes in a common region and then to the sense node, increases the effective exposure, sensitivity; and thus, a better resolution.

4.) A high frame rate imaging mode of operation for motion adaptive signal integration (MASI) and/or short integration time with high gain for motion blur reduction. A high frame rate for motion adaptive signal integration (MASI) can be an imaging-mode of operation using a readout of photodiodes from a pixel 100 with multiple photodiodes. The high frame rate MASI algorithm achieves a high dynamic range by combining high frame rate images of varying exposures. The high frame rate mode can still implement binning, unbinned, and extended dynamic range in a given pixel 100. Note, a high frame rate could also cut out a certain amount of rows or even individual pixels from being read to match a data throughput of the image sensor. Thus, the first decoder can select a subset of the rows, such as 60 rows, which will have their charge readout from a total amount of rows, such as 80 rows, making up that image sensor.

4) Extended dynamic range from low lighting conditions up to sunny conditions. The extended dynamic range imaging-mode of operation can be an imaging-mode of operation using a readout of multiple photodiodes from a pixel 100. The dynamic range can be a metric of how well a sensor can measure an accurate signal at low light intensities all the way up until it reaches full well capacity. The extended dynamic range can be achieved by adjusting the effective integration time of the four photodiodes.

In an embodiment, the quad pixel design discussed herein are capable of providing 2× (or more) read noise reduction when compared to some other prior designs. In one embodiment, the system consists of a quad design where four, 8×8 um pixels are either individually read out or their charge is combined/binned to form a 16×16 um super pixel. The 16×16 um pixel collects 4× more signal for the lowest light levels. This design reduces read noise by 2X while allowing improved imaging with merely starlight illumination.

The present invention has been described in terms of one or more embodiments, and it should be appreciated that many equivalents, alternatives, variations, and modifications, aside from those expressly stated, are possible and within the scope of the invention.

The invention claimed is:

1. An apparatus, comprising:

an image sensor having a set of pixels making up the image sensor to capture an image, where two or more pixels in the set of pixels each have an architecture that includes multiple photodiodes configurable to form an individual pixel, where the multiple photodiodes are readout through a common output stage that includes a sense node, where a control system is configured to cooperate with the multiple photodiodes to configure the multiple photodiodes to form the individual pixel, where the multiple photodiodes include a first photodiode and a second photodiode, where the first photodiode and the second photodiode each have a transfer gate electrically coupled to that photodiode, a common region electrically coupled to the sense node to hold or transfer charge received from at least the first photodiode, at least during or after an integration time, and one or more read gates electrically coupled to the sense node to bin the charge received from at least the first photodiode and the second photodiode, at least during the integration time, where the control system is configured to send a control signal to the one or more read gates to supply the binned charge from the first and second photodiodes in the common region through the one or more read gates to the sense node with merely one read operation, where the control system is configured to send control signals to transfer gates associated with the first photodiode and the second photodiode to simultaneously switch on in order to transfer their charge to the common region during the integration time in order for the common region to bin the charge from the first photodiode and the second photodiode, where the sense node has no capacitor connected to the sense node; and instead, merely the common region connected to the sense node through the one or more read gates to store or hold the charge in order to decrease an amount capacitance associated with the sense node.

2. The apparatus of claim 1, where the one or more read gates include at least a first read gate and a second read gate as well as are configured to function as the common region, where the common region is split into a first common region to transfer the charge from the first photodiode and the second photodiode during the integration time, and a second common region to transfer charge from a third photodiode and a fourth photodiode during the integration time.

3. The apparatus of claim 1, where the multiple photodiodes are configured to collect the charge during the integration time, where the common region is configured to hold the charge from the first photodiode and the second photodiode, where a first read gate is configured to supply the held charge from the common region through the first read gate to the sense node during the one read operation.

4. The apparatus of claim 3, where the first photodiode and the second photodiode are configured to simultaneously supply their charge to the common region during the integration time in order for the common region to bin the charge from the first and second photodiodes at least during or after the integration time, where the control system is configured to send the control signal to operate the image sensor in a rolling shutter operational mode such that the multiple photodiodes simultaneously collect the charge to be moved through the transfer gates of the first and second photodiodes into the common region to be binned during the integration time, and the first read gate then is configured to supply the charge from the common region through the first read gate to the sense node during the one read operation.

5. The apparatus of claim 3, where the multiple photodiodes within the individual pixel include a third photodiode and a fourth photodiode, where the common region is configured to store the charge from the first photodiode, the second photodiode, the third photodiode, and the fourth photodiode during the integration time.

6. The apparatus of claim 1, where the common region is configured to hold or transfer the charge at least during or after the integration time; and where the one or more read gates electrically coupled to the common region and the sense node are configured to supply the charge from the common region through a first read gate to the sense node.

7. The apparatus of claim 1, wherein the control system is configured to send a first control signal to the multiple photodiodes to simultaneously collect the charge during the integration time, and to send a second control signal to the associated transfer gates of the first photodiode and the second photodiode to move the charge accumulated in at least the first photodiode and the second photodiode of the multiple photodiodes at a same time through their associated transfer gate coupled to that photodiode into the common region for binning the charge supplied by the first and second photodiodes at least during the integration time, and where the control system is further configured to then send a third control signal for the one read operation to transfer the binned charge in the common region through a first read gate to the sense node, and the control system when operating in a rolling shutter mode is configured to do the above sequence of the three control signals on a row of photodiodes by row of photodiodes basis, doing all of the rows within a time frame of one image frame.

8. The apparatus of claim 1, where the common region has charge channels from a photodiode output from the first photodiode and a photodiode output from the second photodiode, which pass through the associated transfer gates of the first photodiode and the second photodiode electrically coupled to that photodiode, through a well of the common region, and to a first read gate.

9. A method for an image sensor having a control system implementing a rolling shutter, comprising:

simultaneously moving charge from multiple photodiodes forming a pixel through an associated transfer gate into a common region for binning charge supplied by two or more photodiodes during an integration time, sending control signals to transfer gates associated with a first photodiode and a second photodiode to simultaneously switch on in order to transfer their charge to the common region during the integration time in order for the common region to bin the charge from the first photodiode and the second photodiode, where a sense node has no capacitor connected to the sense node; and instead, merely the common region connected to the sense node through one or more read gates to store or hold charge in order to decrease an amount of capacitance associated with the sense node, and then sending a control signal to one or more read gates to supply the binned charge from the two or more photodiodes in the common region through the one or more read gates to the sense node with merely one read operation.

10. The method of claim 9, further comprising:

collecting the charge during the integration time with the multiple photodiodes;

storing and binning the charge from the two or more photodiodes in the common region during the integration time, and then supplying the binned charge from the common region through a first read gate to the sense node during the one read operation.

11. The method of claim 10, further comprising:

sending control signals to operate the image sensor in a rolling shutter operational mode such that the multiple photodiodes simultaneously collect charge to be moved through the associated transfer gates of the first photodiode and the second photodiode into the common region to be binned during the integration time, and the first read gate then supplies the charge from the common region through the first read gate to the sense node during the one read operation.

12. The method of claim 9, where the multiple photodiodes forming the pixel includes at least four photodiodes, and moving the charge into the common region to store the charge from all of the multiple photodiodes during the integration time.

13. The method of claim 9, further comprising:

holding or transferring the charge in the common region at least during or after the integration time; and where the one or more read gates are electrically coupled to the common region and the sense node, and where a first read gate supplies the charge from the common region through that read gate to the sense node.

14. The method of claim 9, where the one or more read gates include at least a first read gate and a second read gate as well as are configured to function as the common region, where the common region is split into a first common region to transfer the charge from the first photodiode and the second photodiode during the integration time, and a second common region to transfer charge from a third photodiode and a fourth photodiode during the integration time.

15. The method of claim 9, further comprising:

sending a first control signal to the multiple photodiodes and their associated transfer gates to simultaneously collect the charge during the integration time, sending a second control signal to the associated transfer gates to then move the charge accumulated in at least the first photodiode and the second photodiode of the multiple photodiodes at a same time through their associated transfer gate coupled to that photodiode into the common region for binning the charge supplied by the first and second photodiodes at least during or after the integration time, and sending a third control signal for the one read operation to transfer the binned charge in the common region through a first read gate to the sense node, and the control system when operating in a rolling shutter mode is configured to do the above sequence of the three control signals on a row of photodiodes by row of photodiodes basis doing all of the rows within a time frame of one image frame.

16. The method of claim 9, where the common region has charge channels from a photodiode output from the first photodiode and a photodiode output from the second photodiode in the multiple photodiodes, which run under the transfer gate electrically coupled to that photodiode, through a well of the common region, and to a first read gate.

17. A method for an image sensor having a set of pixels making up the image sensor to capture an image, comprising:

creating two or more pixels in the set of pixels to each have an architecture that includes multiple photodiodes configurable to form an individual pixel, configuring a control system to cooperate with the multiple photodiodes to form the individual pixel, where a first photodiode and a second photodiode of the multiple photodiodes each have a transfer gate electrically coupled to that photodiode, creating a common region electrically coupled to a sense node to hold or transfer charge received from at least the first photodiode, at least during an integration time, creating one or more read gates electrically coupled to the sense node to bin the charge received from at least the first photodiode and the second photodiode, at least during the integration time, creating the control system to send control signals to transfer gates associated with the first photodiode and the second photodiode to simultaneously switch on in order to transfer their charge to the common region during the integration time in order for the common region to bin the charge from the first photodiode and the second photodiode, where the sense node has no capacitor connected to the sense node; and instead, merely the common region connected to the sense node through the one or more read gates to store or hold charge in order to decrease an amount of capacitance associated with the sense node, and creating the control system to send a control signal to the one or more read gates to supply the binned charge from the first and second photodiodes in the common region through the one or more read gates to the sense node with merely one read operation.

* * * * *